(12) United States Patent
Bayless et al.

(10) Patent No.: US 10,403,598 B2
(45) Date of Patent: Sep. 3, 2019

(54) METHODS AND SYSTEM FOR PROCESSING SEMICONDUCTOR DEVICE STRUCTURES

(71) Applicant: Micron Technology, Inc., Boise, ID (US)

(72) Inventors: Andrew M. Bayless, Boise, ID (US); Joseph M. Brand, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/674,850

(22) Filed: Aug. 11, 2017

(65) Prior Publication Data

US 2019/0051630 A1 Feb. 14, 2019

(51) Int. Cl.
*H01L 23/00* (2006.01)
*H01L 21/683* (2006.01)

(52) U.S. Cl.
CPC .......... *H01L 24/98* (2013.01); *H01L 21/6835* (2013.01); *H01L 23/562* (2013.01)

(58) Field of Classification Search
CPC ....... H01L 21/6835; H01L 2221/68381; H01L 2221/68318; H01L 2221/68327; B32B 43/006; B32B 7/12
USPC .................................. 438/455, 458; 156/711
See application file for complete search history.

(56) References Cited

U.S. PATENT DOCUMENTS

| | | | |
|---|---|---|---|
| 7,989,266 B2 | 8/2011 | Borthakur et al. | |
| 2009/0218560 A1 | 9/2009 | Flaim et al. | |
| 2011/0014774 A1 | 1/2011 | Johnson et al. | |
| 2012/0034437 A1 | 2/2012 | Puligadda et al. | |
| 2014/0057450 A1 | 2/2014 | Bourbina et al. | |
| 2014/0311680 A1* | 10/2014 | Kubo | H01L 21/6835 156/711 |
| 2015/0035554 A1* | 2/2015 | Dang | B23K 26/36 324/756.01 |
| 2015/0228849 A1 | 8/2015 | Zou et al. | |
| 2016/0133486 A1* | 5/2016 | Andry | H01L 21/78 428/40.4 |
| 2016/0284583 A1* | 9/2016 | Dang | H01L 21/02057 |
| 2017/0040200 A1* | 2/2017 | Bai | B32B 7/06 |
| 2017/0194185 A1* | 7/2017 | Andry | H01L 21/566 |

* cited by examiner

*Primary Examiner* — Jonathan Han
(74) *Attorney, Agent, or Firm* — TraskBritt

(57) ABSTRACT

Methods of detaching semiconductor device structures from carrier structures may involve directing a laser through a carrier structure comprising a semiconductor material to a barrier material located between the carrier structure and a semiconductor device structure adhere to an opposite side of the barrier material. A bond between the carrier structure and an adhesive material temporarily securing the carrier structure to the semiconductor device structure may be released in response to heating of the barrier material by the laser beam. The carrier structure may be removed from the semiconductor device structure, the barrier material removed, and an adhesive bonding the semiconductor device structure to the barrier material removed.

21 Claims, 5 Drawing Sheets

METHODS AND SYSTEM FOR PROCESSING SEMICONDUCTOR DEVICE STRUCTURES

FIELD

This disclosure relates generally to methods of fabricating semiconductor devices. More specifically, disclosed embodiments relate to methods and systems for processing semiconductor device structures that may reduce stress, increase yield, withstand exposure to higher processing temperatures, and enable use of otherwise difficult-to-use materials.

BACKGROUND

Conventional wafer carrier systems adhesively bond a process wafer, which may also be characterized as a device wafer, to a carrier for back side processing including substantial thinning of the process wafer, after which the process wafer and carrier are separated. However, conventional laser-release carrier removal systems have temperature constraints, require the use of a glass carrier, and have yield issues Such systems employing thermal slide de-bond methods require thermal plastic adhesive materials that exhibit a low glass transition temperature ($T_g$) that limit the use of high temperature thermal processes and require thin wafer handling techniques that are difficult to apply to very thin, warped wafers. Other conventional systems employing mechanical de-bond techniques have a narrow process window that applies a large tensile force to the thin wafer.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

FIGS. 11 and 12 are cross-sectional side views of a ninth stage in the process of handling the semiconductor device structure.

DETAILED DESCRIPTION

The illustrations presented in this disclosure are not meant to be actual views of any particular wafer, wafer assembly, act in a process of handling a semiconductor device structure, system or component thereof, but are merely idealized representations employed to describe illustrative embodiments. Thus, the drawings are not necessarily to scale.

Disclosed embodiments relate generally to methods and apparatus for handling semiconductor device structures that may reduce stress on wafers, increase product yield, better withstand exposure to higher processing temperatures, and enable use of otherwise difficult-to-use materials. More specifically, disclosed are embodiments of methods and apparatus for handling semiconductor device structures that may involve placing a barrier material between a carrier structure including a semiconductor material and a semiconductor device structure, securing the carrier structure to the semiconductor device structure, and subsequently removing the carrier structure from the semiconductor device structure at least partially in response to energy from a laser directed through the carrier structure to heat the barrier material.

Figure 1:
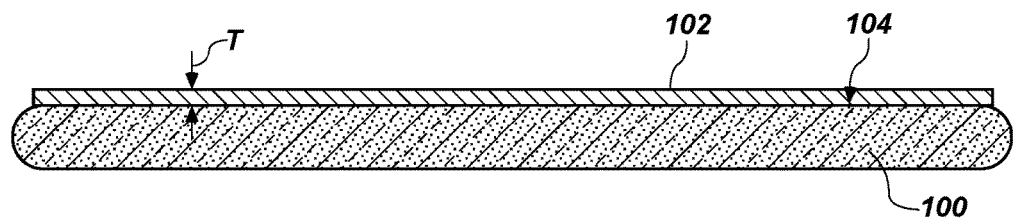
FIG. 1 is a cross-sectional side view of a first stage in a process of handling a semiconductor device structure.

Referring to FIG. 1, a cross-sectional side view of a first stage in a process of handling a semiconductor device structure is shown. As shown in FIG. 1, a carrier structure 100 may be prepared for temporary attachment to a semiconductor device structure. The carrier structure 100 may include, for example, a rigid semiconductor material or non-semiconducting material. More specifically, the carrier structure 100 may include, for example, a silicon material or a glass material. As a specific, nonlimiting example, the carrier structure 100 may comprise silicon material (e.g., commercially pure silicon material. The carrier structure 100 may be, for example, devoid of integrated circuitry embedded within the material of the carrier structure 100. The carrier structure 100 may be configured as, for example, a carrier wafer or other substrate of semiconductor material (e.g., silicon) or non-semiconducting material (e.g., glass).

A first adhesive material 102 may be placed on a surface 104 of the carrier structure 100. The first adhesive material 102 may include a polymer material formulated to temporarily secure the carrier structure 100 to a semiconductor device structure. More specifically, the first adhesive material 102 may include a thermoset or a thermoplastic polymer material formulated to withstand high processing temperatures, such as those employed in material deposition, without permitting relative lateral or vertical movement between the carrier structure 100 and a semiconductor device structure secured thereto. As a specific, nonlimiting example, the first adhesive material 102 may include a cured or partially cured thermoset material or a precursor for forming a thermoset material (e.g., silicone adhesive 401LC, commercially available from Shin-Etsu Silicones of America, Inc., 1150 Damar Drive, Akron, Ohio 44305; adhesive BSI.T14049A; adhesive BSI.D16052K, each commercially available from Brewer Science, 2401 Brewer Drive, Rolla, Mo. 65401; or a precursor material or partially cured variant thereof). The first adhesive material 102 may be temporarily secured to the surface 104 of the carrier structure 100 by its adhesive properties.

A first thickness $T_1$ of the first adhesive material 102 as measured in a direction perpendicular to the surface 104 of the carrier structure 100 on which the first adhesive material 102 is located may be, for example, between about 0.5 micron and about 5 microns. More specifically, the first thickness $T_1$ of the first adhesive material 102 may be, for example, between about 1 micron and about 4 microns. As a specific, nonlimiting example, the first thickness $T_1$ of the first adhesive material 102 may be, for example, between about 2 microns and about 3 microns (e.g., about 2.5 microns). It is desirable that the thickness $T_1$ of first adhesive material 102 be substantially uniform across the surface of the carrier structure 100 to which it is applied.

Figure 2:
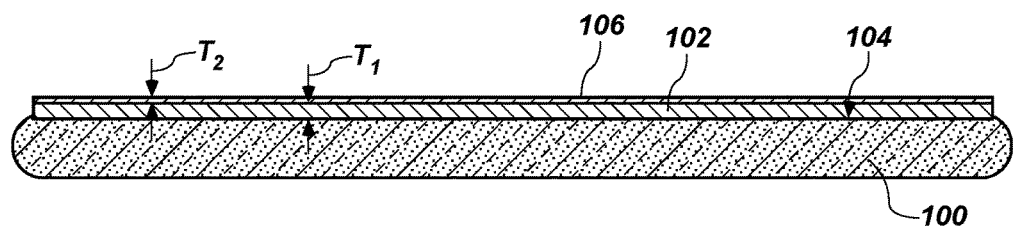
FIG. 2 is a cross-sectional side view of a second stage in the process of handling the semiconductor device structure.

FIG. 2 is a cross-sectional side view of a second stage in the process of handling the semiconductor device structure. A barrier material 106 may be placed adjacent to the first adhesive material 102 on a side of the first adhesive material 102 opposite the carrier structure 100. The barrier material 106 may bond to the first adhesive material 102 by, for example, adhesive characteristics of the first adhesive material 102. The barrier material 106 may include, for example, a metal material or a ceramic material. More specifically, the barrier material 106 may include, for example, titanium, tungsten, aluminum, copper, titanium nitride, tungsten nitride, alloys comprising such materials, or composite materials comprising such materials. The barrier material 106 may be placed or formed on the first adhesive material 102 by, for example, sputtering, chemical vapor deposition, physical vapor deposition, laser metal deposition, direct metal deposition, plating, or other conventional deposition or placement processes. In embodiments where a precursor material of the first adhesive material 102 is placed on the carrier structure 100 or where the first adhesive material 102 is initially only partially cured, the precursor material or partially cured material may be fully cured during or after placement of the barrier material 106 to form the first adhesive material 102.

A second thickness $T_2$ of the barrier material 106 as measured in a direction perpendicular to the surface 104 of the carrier structure 100 on which the first adhesive material 102 is located may be, for example, between about 0.2% and about 100% of the first thickness $T_1$ of the first adhesive material 102. More specifically, the second thickness $T_2$ of the barrier material 106 may be, for example, between about 3% and about 30% of the first thickness $T_1$ of the first adhesive material 102. As a specific, nonlimiting example, the second thickness $T_2$ of the barrier material 106 may be, for example, between about 5% and about 15% of the first thickness $T_1$ of the first adhesive material 102. As another example, the second thickness $T_2$ of the barrier material 106 may be between about 100 Å and about 0.5 micron. More specifically, the second thickness $T_2$ of the barrier material 106 may be, for example, between about 250 Å and about 0.3 micron. As a specific, nonlimiting example, the second thickness $T_2$ of the barrier material 106 may be, for example, between about 500 Å and about 0.1 micron. It is desirable that the thickness $T_2$ of barrier material 106 be substantially uniform across the surface of the carrier structure 100 to which it is applied.

Figure 3:
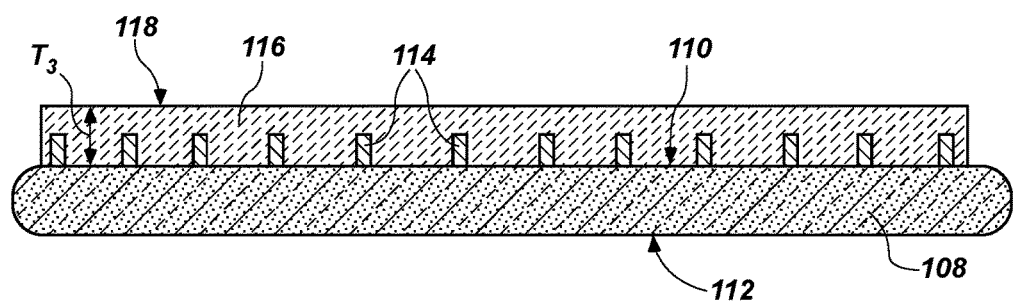
FIG. 3 is a cross-sectional side view of a third stage in the process of handling the semiconductor device structure.

FIG. 3 is a cross-sectional side view of a third stage in the process of handling the semiconductor device structure 108. The semiconductor device structure 108, which as noted above may be characterized as a process or device wafer, may include a semiconductor material configured as a wafer or other bulk semiconductor substrate, a wafer segment or one or more semiconductor devices. More specifically, the semiconductor device structure 108 may comprise, for example, a silicon material. As a specific, nonlimiting example, the semiconductor device structure 108 may comprise silicon material (e.g., commercially pure silicon material). In some embodiments, the semiconductor material of the semiconductor device structure 108 may be the same as the semiconductor material of the carrier structure 100 (see FIGS. 1, 2). In other embodiments, the semiconductor material of the semiconductor device structure 108 may be different from the semiconductor material of the carrier structure 100 (see FIGS. 1, 2)

The semiconductor device structure 108 may include an active surface 110 having integrated circuitry located thereon and an inactive (e.g., back side) surface 112 located on a side of the semiconductor device structure 108 opposite the active surface 110. The inactive surface 112 may be, for example, devoid of integrated circuitry or other elements. Conductive elements 114 in electrical communication with the integrated circuitry of the active surface 110 may extend from the active surface. The conductive elements 114 may include, for example, bond pads, bumps, columns, pillars, or other structures configured to enable operative connection between the integrated circuitry of the active surface 110 and an interposer, circuit board or other higher-level packaging. The semiconductor device structure 108 may be configured as, for example, a wafer or other bulk substrate having an array of die locations for subsequent singulation from one another a wafer segment, or an individual die of semiconductor material. More specifically, the semiconductor device structure 108 may include, for example, stacks of semiconductor dice on the active surface 110 of a wafer, the stacks encapsulated in a molding compound. As another more specific example, the semiconductor device structure 108 may include, for example, two or more laterally adjacent semiconductor dice on the active surface 110 of a wafer. In other embodiments, the semiconductor device structure 108 may lack an active surface 110 bearing integrated circuitry, and may be in the form of a blank semiconductor wafer, wafer segment or die. In such other embodiments, a second adhesive material 116 may be placed on either surface of the semiconductor device structure 108.

As shown in FIG. 3, a second adhesive material 116 may be placed on the active surface 110 of the semiconductor device structure 108 over conductive elements 114. The second adhesive material 116 may be different from the first adhesive material 102 and be formulated to withstand similar or higher process temperatures. The second adhesive material 116 may include a polymer material formulated to temporarily secure the semiconductor device structure 108 to the carrier structure 100 (see FIGS. 1, 2). More specifically, the second adhesive material 116 may comprise a thermoplastic polymer material capable of withstanding high processing temperatures, such as those employed in material deposition, without permitting relative movement between the semiconductor device structure 108 and the carrier structure 100. A glass transition temperature $T_g$ of the second adhesive material 116 may be, for example, at least about 70° C. or greater. More specifically, the glass transition temperature of the second adhesive material 116 may be, for example, between about 70° C. and about 400° C. As a specific, nonlimiting example, the glass transition temperature of the second adhesive material 116 may be, for example, between about 100° C. and about 250° C. As specific, nonlimiting examples, the second adhesive material 116 may include adhesive BSI.T15126B or adhesive BSI.T15140E, each commercially available from Brewer Science, 2401 Brewer Drive, Rolla, Mo. 65401. The second adhesive material 116 may be temporarily secured to the active surface 110 of the semiconductor device structure 108 by its adhesive characteristics below its $T_g$. A surface 118 of the second adhesive material 116 located on a side of the second adhesive material 116 opposite the semiconductor device structure 108 may remain exposed for subsequent attachment to the barrier material 106 (see FIG. 2).

A third thickness $T_3$ of the second adhesive material 116 as measured in a direction perpendicular to the active surface 110 of the semiconductor device structure 108 on which the second adhesive material 116 is located may be at least as great as a greatest height of the conductive elements 114 or other components, if present, above the active surface 110. In instances where additional components are located on the active surface 110, for example die stacks or laterally adjacent dice, thickness $T_3$ may exceed the height of such additional components. For example, the third thickness $T_3$ of the second adhesive material 116 may be between about 10 times and about 200 times the first thickness $T_1$ of the first adhesive material 102. More specifically, the third thickness $T_3$ of the second adhesive material 116 may be, for example, between about 50 times and about 150 times the first thickness $T_1$ of the first adhesive material 102. As a specific, nonlimiting example, the third thickness $T_3$ of the second adhesive material 116 may be, for example, between about 75 times and about 125 times (e.g., about 100 times) the first thickness $T_1$ of the first adhesive material 102. As another example, the third thickness $T_3$ of the second adhesive material 116 may be between about 50 microns and about 100 microns. More specifically, the third thickness $T_3$ of the second adhesive material 116 may be, for example, between about 60 microns and about 90 microns. As a specific, nonlimiting example, the third thickness $T_3$ of the second adhesive material 116 may be, for example, between about 70 microns and about 80 microns (e.g., about 75 microns).

Figure 4:
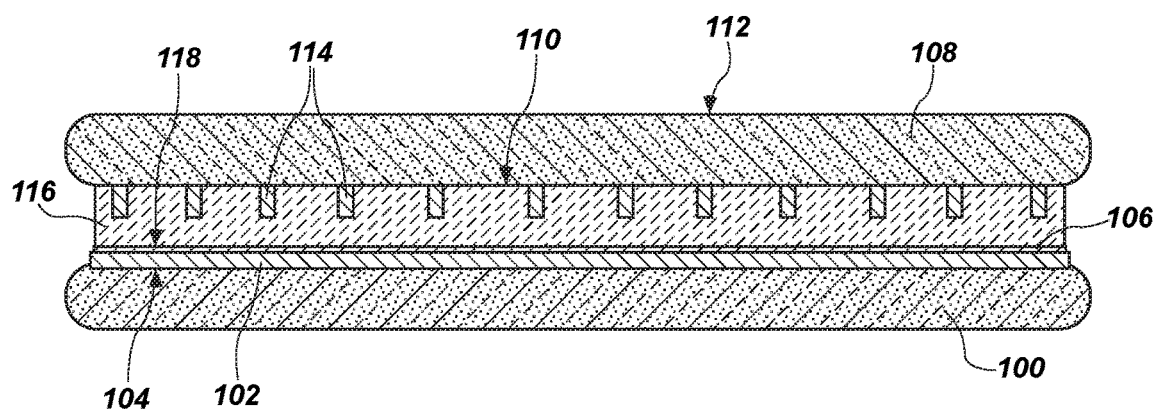
FIG. 4 is a cross-sectional side view of a fourth stage in the process of handling the semiconductor device structure.

FIG. 4 is a cross-sectional side view of a fourth stage in the process of handling the semiconductor device structure 108. During the fourth stage, the barrier material 106 may be temporarily secured to the second adhesive material 116, interposed between the first adhesive material 102 and the second adhesive material 116. As a result, the carrier structure 100 may be temporarily secured to the semiconductor device structure 108. More specifically, the carrier structure 100 may be adhered to the first adhesive material 102, which may be adhered to the barrier material 106, which may be adhered to the second adhesive material 116, which may be adhered to the semiconductor device structure 108. The carrier structure 100 may support and reinforce the semiconductor device structure 108 during subsequent processing and handling.

As shown in FIG. 4, the active surface 110 of the semiconductor device structure 108 may face the surface 104 of the carrier structure 100 on which the first adhesive material 102 is located in some embodiments.

Figure 5:
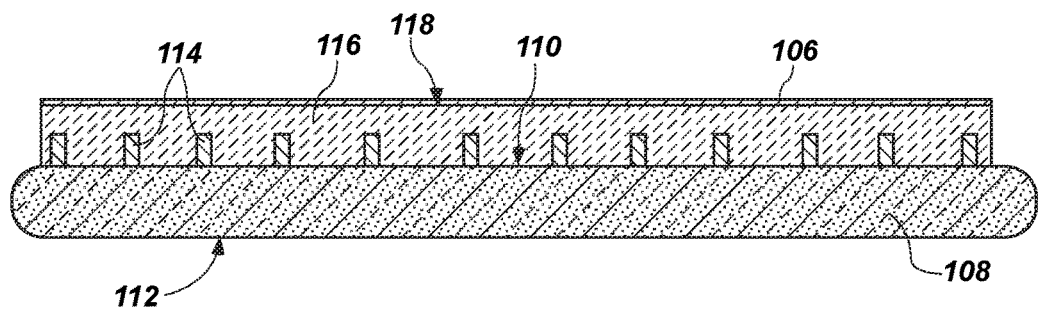
FIG. 5 is a cross-sectional side view of another embodiment of a first stage in the process of handling the semiconductor device structure.

FIG. 5 is a cross-sectional side view of another embodiment of a first stage in the process of handling the semiconductor device structure 108. Rather than preplacing the barrier material 106 on the first adhesive material 102 or a precursor thereof located on the carrier structure 100, the barrier material 106 may be placed adjacent to the second adhesive material 116 on a side of the second adhesive material 116 opposite the semiconductor device structure 108. In other words, the barrier material 106 may be located on, and adhered to, the second adhesive material 116, the second adhesive material 116 being located between the barrier material 106 and the semiconductor device structure 108. The semiconductor device structure 108, second adhesive material 116, and barrier material 106 may otherwise be at least substantially the same as described previously in connection with FIGS. 2 and 3.

Figure 6:
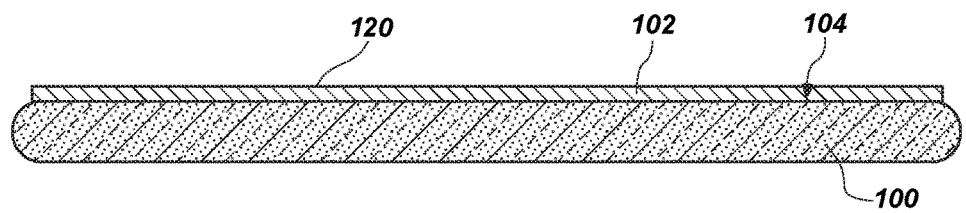
FIG. 6 is a cross-sectional side view of another embodiment of a second stage in the process of handling the semiconductor device structure.

FIG. 6 is a cross-sectional side view of another embodiment of a second stage in the process of handling the semiconductor device structure. In embodiments where the barrier material 106 is initially secured to the second adhesive material 116, such as that shown in FIG. 5, the first adhesive material 102, or a precursor or partially cured version thereof, may be placed on the carrier structure 100 without the barrier material 106. In other words, the first adhesive material 102 may be located adjacent, and adhered, to the surface 104 of the carrier structure 100. A surface 120 of the first adhesive material 102, or a precursor or partially cured version thereof, located on a side of the first adhesive material 102 opposite the carrier structure 100 may remain exposed for subsequent attachment to the barrier material 106 (see FIG. 5). The carrier structure 100 and the first adhesive material 102, or precursor or partially cured version thereof, may otherwise be at least substantially the same as described previously in connection with FIG. 1.

After such an alternative second stage, and with reference to FIG. 4, the barrier material 106 may be temporarily secured to the first adhesive material 102, such that the barrier material 106 may be interposed between the second adhesive material 116 and the first adhesive material 102. As a result, the carrier structure 100 may be temporarily secured to the semiconductor device structure 108. More specifically, the carrier structure 100 may be adhered to the first adhesive material 102, which may be adhered to the barrier material 106, which may be adhered to the second adhesive material 116, which may be adhered to the semiconductor device structure 108. In embodiments where the first adhesive material 102 is initially in the form of a precursor or partially cured material, the first adhesive material 102 may be fully cured before, during, or after being placed in contact with the barrier material 106, ultimately resulting in temporary attachment between the first adhesive material 102 and the barrier material 106.

Figure 7:
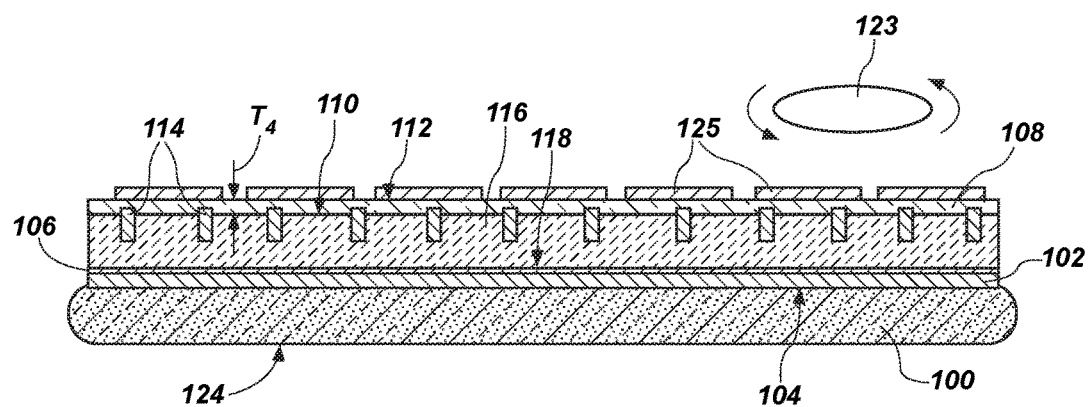
FIG. 7 is a cross-sectional side view of a fifth stage in the process of handling the semiconductor device structure.

FIG. 7 is a cross-sectional side view of a fifth stage in the process of handling the semiconductor device structure 108. After temporarily securing the carrier structure 100 to the semiconductor device structure 108, additional processing and handling of the semiconductor device structure 108, and optionally of the carrier structure 100, may take place. For example, a fourth thickness $T_4$ of the semiconductor device structure 108 in the form of a wafer or other substrate of semiconductor material may be reduced to a final magnitude. More specifically, material of the semiconductor device structure 108 may be removed from the inactive surface 112 by a grinding process until the fourth thickness $T_4$ of the semiconductor device structure 108 is at a final, predetermined magnitude. For example, semiconductor device structure 108 in wafer form may be reduced from an initial thickness of 700 to 800 microns to a final thickness of 50 microns or less.

In some embodiments, such as, for example, those in which the carrier structure 100 includes a semiconductor material (e.g., silicon), the carrier structure 100 may be planarized before reducing the fourth thickness $T_4$ of the semiconductor device structure 108 using the same chuck and avoiding transfer of the assembly from one chuck to another. For example, material of the carrier structure 100 may be removed by back grinding from a surface 124 of the carrier structure 100 located on a side of the carrier structure 100 opposite the semiconductor device structure 108 in a manner that renders the surface 124 more planar (e.g., reduces a surface roughness, reduces a maximum deviation of the surface 124 from a plane located at an average elevation of the surface 124 to about 3 microns or less). Such enhanced planarity of the surface 124 of the carrier structure 100 in comparison to a deviation of about 7 to about 8 microns as is conventional, may serve as a more precise reference for the reduction in the fourth thickness $T_4$ of the semiconductor device structure 108 and other processing and handling that may occur, which may produce more consistent predictable results, increasing yield and reducing variation in thickness across the semiconductor device structure 108. This enables less variation in die thickness, less stress on dice during pick and place operations, ensures successful exposure and completion of conductive through vias on the inactive surface 112 of the semiconductor device structure and generally reduces process variation. In addition, the same thickness-reduction device 123 (e.g., the same chuck and grinding apparatus) may be used to planarize the carrier structure 100 and the semiconductor device structure 108 in embodiments where the carrier structure 100 and the semiconductor device structure 108 include semiconductor materials.

Additional processing which may be performed on the semiconductor device structure 108, which may also benefit from the support of the carrier structure 100 during handling, may include, for example, completion of through-silicon vias through the fourth thickness $T_4$ of the semiconductor device structure 108, metallization of the inactive surface 112 of the semiconductor device structure 108 (e.g., formation of traces, bond pads, or other electrically conductive structures 125, which may be accomplished by, for example, selectively masking, etching, and depositing electrically conductive material on the active surface 110), formation of a redistribution layer on the inactive surface 112, stacking semiconductor dice on the inactive surface 112 to at least partially form a package, and other processing techniques known in the art for semiconductor device structures 108 which may benefit from the reinforcement provided by the carrier structure 100.

Because thermoset and high glass-transition temperature thermoplastic may be utilized for the first and second adhesive materials 102 and 116, higher-temperature processes may be employed on the semiconductor device structure without inducing relative movement between the carrier structure 100 and the semiconductor device structure 108. For example, any deposition of material (e.g., electrically conductive material) may be effected at higher temperatures than would be permissible if low glass-transition temperature thermoplastics were used.

Figure 8:
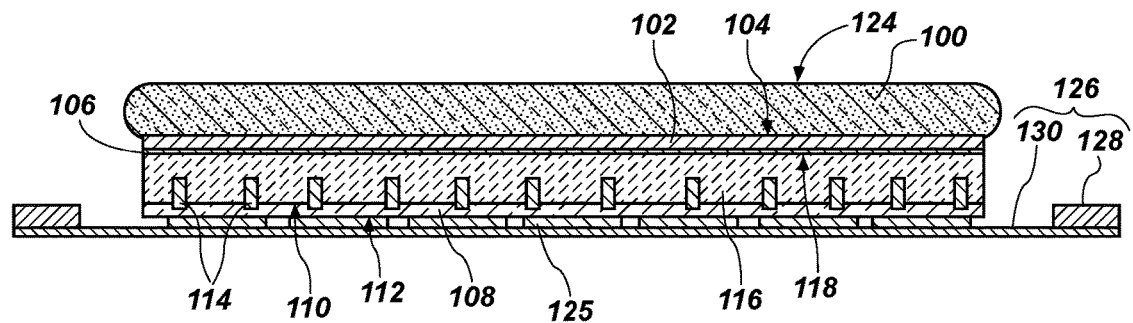
FIG. 8 is a cross-sectional side view of a sixth stage in the process of handling the semiconductor device structure.

FIG. 8 is a cross-sectional side view of a sixth stage in the process of handling the semiconductor device structure 108. During the sixth stage, the semiconductor device structure 108 may be prepared for subsequent removal from the carrier structure 100. For example, the semiconductor device structure 108 may be temporarily supported on a support structure 126, the support structure located on a side of the semiconductor device structure 108 opposite the carrier structure 100. The support structure 126 may be configured as, for example, a film frame, a lead frame, a tape, or another structure different from the carrier structure 100 initially secured to the semiconductor device structure 108. The semiconductor device structure 108 may simply rest on the support structure 126 under the influence of gravity with the support structure 126 located underneath the semiconductor device structure 108, or the semiconductor device structure 108 may be temporarily secured to the support structure 126 in any orientation. In embodiments where the support structure 126 is configured as a film frame, the support structure 126 may include, for example, a peripheral frame 128 laterally surrounding the semiconductor device structure 108 and a film 130 secured to the peripheral frame 128, the film 130 located adjacent to, and in some embodiments temporarily adhesively secured to, the inactive surface 112 of the semiconductor device structure 108. Because the semiconductor device structure 108 is already supported on the support structure 126 during removal of the carrier structure 100, handling equipment relying on a vacuum to manipulate the carrier structure 100, semiconductor device structure 108, or both may not be required. Without the application of a vacuum, methods of processing in accordance with this disclosure may reduce the likelihood that damaging flowable materials will be drawn through cracks in the handled structure and that damage resulting from warpage will be induced in the semiconductor device structure 108. As a result, methods of handling in accordance with this disclosure may be better able to accommodate warped or otherwise nonuniform semiconductor device structures 108.

Figure 9:
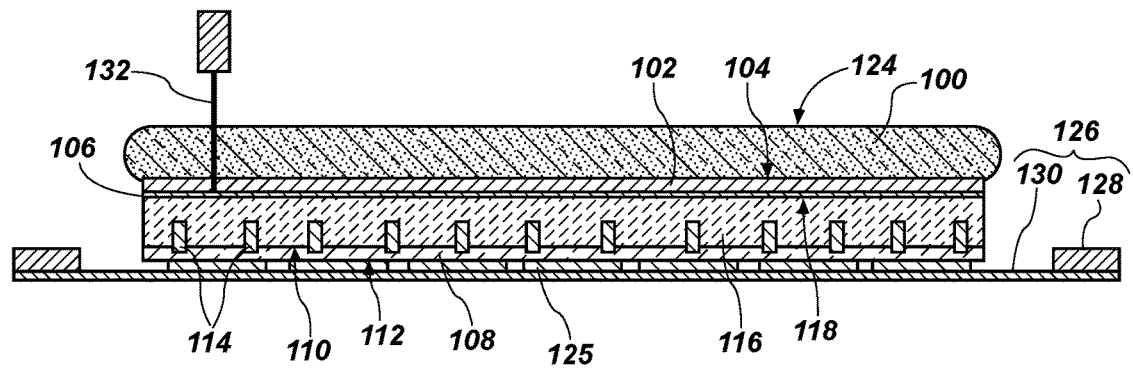
FIG. 9 is a cross-sectional side view of a seventh stage in the process of handling the semiconductor device structure.

FIG. 9 is a cross-sectional side view of a seventh stage in the process of handling the semiconductor device structure 108. During the seventh stage, the carrier structure 100 may be removed from the semiconductor device structure 108. To accomplish such removal, a laser beam 132 may be directed through the semiconductor material of the carrier structure 100 without substantial attenuation, toward the barrier material 106, the semiconductor material exhibiting greater thermal transfer properties than, for example, a glass and does not sag responsive to heating. The laser beam 132 may move laterally (e.g., in a direction at least substantially parallel to the surface 104 of the carrier structure 100 on which the first adhesive material 102 is located) to distribute its energy along and through an entire surface of the carrier structure 100 and the first adhesive material 102. For example, the laser beam 132 may be raster-scanned rapidly across the surface of the carrier structure. The laser beam 132 power may be sufficient, as explained further below, to cause the first adhesive material 102 to release its temporary attachment to the carrier structure 100 while leaving the temporary attachment between the barrier material 106, the second adhesive material 116, and the semiconductor device structure 108 intact. A wavelength of the laser beam 132 may be, for example, an infrared, ultraviolet, or green wavelength. In one embodiment, an infrared laser beam 132 is employed at a wavelength of between about 700 nm and about 1 mm. More, specifically, the wavelength of the laser beam 132 may be between about 1,000 nm and about 1,500 nm. A power rating of the laser beam 132 may be, for example, between about 0.2 W at about 90 kHz and about 5.0 W at about 90 kHz. More specifically, the power rating of the laser beam 132 may be, for example, between about 0.8 W at about 90 kHz and about 2.5 W at about 90 kHz. As a specific, nonlimiting example, a Hamamatsu laser that emits a laser beam at a wavelength of about 1,300 nm with a power rating of between about 0.8 W at about 90 kHz and about 2.5 W at about 90 kHz may be used.

The laser beam 132 may penetrate the carrier structure 100 and the first adhesive material 102 to the barrier material 106, which may block passage of the laser beam 132, absorb energy thereof, and heat the first adhesive material 102. As a result, the laser beam 132 may induce a heat-affected zone within the barrier material 106, although the barrier material 106 may remain intact and may remain temporarily secured to the second adhesive material during and at least immediately after the laser beam 132 is directed toward the barrier material 106.

In embodiments where the first adhesive material 102 comprises a thermoset material, the thermoset material may degrade in response to heat from the laser beam 132. More specifically, the thermoset material of the first adhesive material 102 may vaporize or ash (e.g., may thoroughly burn, fracturing covalent bonds in the first adhesive material 102, leaving a residue that no longer adheres the barrier material 106 to the carrier structure 100) in response to heat of barrier material 106 induced by the laser beam 132. In embodiments where the first adhesive material 102 includes a thermoplastic, the thermoplastic material may soften or melt in response to heat of the barrier material 106 induced by the laser beam 132. More specifically, the thermoplastic material of the first adhesive material 102 may soften to the degree where it no longer adheres the barrier material 106 to the carrier structure.

The barrier material 106 may act as a heat sink and reduce substantially the extent to which heat from the laser beam 132 is transferred to the second adhesive material 116 through the barrier material 106, while the relatively greater third thickness $T_3$ of the second adhesive material 116 may act as an insulator to reduce the extent to which heat from the laser beam 132 is transferred to the semiconductor device structure 108. For example, a temperature of the second adhesive material 166 may remain below a glass-transition temperature $T_g$ of the second adhesive material 166 when the laser beam 132 impinges on and heats the barrier material 106. More specifically, the temperature of the second adhesive material 166 may remain below, for example, about 400° C. when the laser beam 132 impinges on the barrier material 106. As a specific, nonlimiting example, the temperature of the second adhesive material 166 may remain below, for example, about 200° C. when the laser beam 132 impinges on the barrier material 106. In some embodiments, the temperature of a small portion of the second adhesive material 116 adjacent barrier material 106 may exceed the glass transition temperature of the second adhesive material 116, but without substantial degradation of the second adhesive material 116 or reduction of adhesion.

A temperature of the semiconductor device structure 108 when the laser beam 132 impinges on the barrier material 106 may remain, for example, substantially below a rated temperature at which a risk of inducing thermal damage to the semiconductor device structure 108 may exist, enabling use of the thermal budget for processing. More specifically, the temperature of the semiconductor device structure 108 when the laser beam 132 impinges on the barrier material 106 may remain below, for example, about 200° C. As a specific, nonlimiting example, the temperature of the semiconductor device structure 108 when the laser beam 132 impinges on the barrier material 106 may remain below about 150° C.

After the bond between the carrier structure 100 and the barrier material 106 has been sufficiently weakened, or completely eliminated, by heat from the laser beam 132, the carrier structure 100 may be removed from the semiconductor device structure 108. For example, a chuck gripping the carrier structure 100 may slide it laterally in response to the application of opposing lateral forces acting on the carrier structure 100 and the semiconductor device structure 108 in embodiments where the first adhesive material 102 comprises a softened or melted thermoplastic material, greatly reducing shear stress on the semiconductor device structure 108. In embodiments where the first adhesive material 102 includes a vaporized or an ashed thermoset material, the carrier structure 100 may simply be displaced vertically by a chuck away from the semiconductor device structure 108 without applying any force on the semiconductor device structure 108 and eliminating tensile stress on the semiconductor device structure 108, as only the weight of the carrier structure 100 maintains it on barrier material 106. In this way, less stress, or no stress other than any inherent thermal stress from any heat absorbed by the semiconductor device structure 108 and any other inherent forces, may be induced within the semiconductor device structure 108 during removal of the carrier structure 100. In other words, zero forces may be imposed by removal of the carrier structure 100 from the semiconductor device structure 108.

Figure 10:
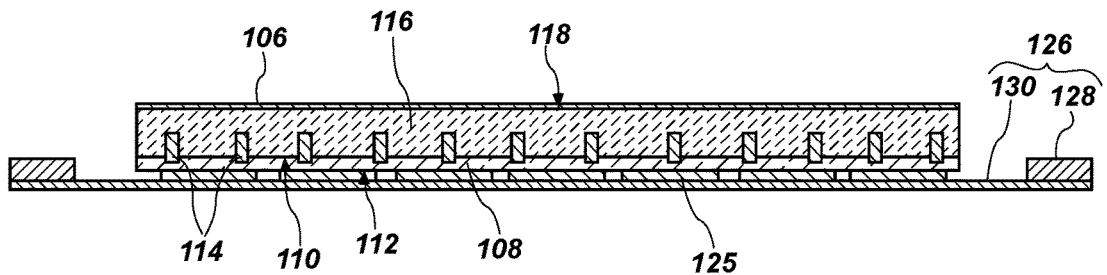
FIGS. 10 and 11 are cross-sectional side views of an eighth stage in the process of handling the semiconductor device structure.
Figure 11:
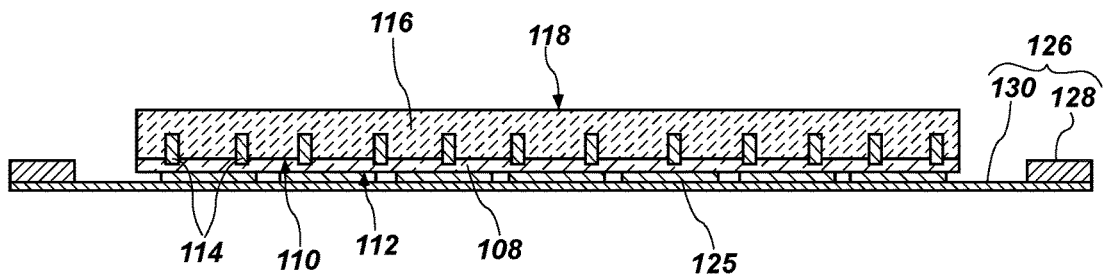

FIGS. 10 and 11 are cross-sectional side views of an eighth stage in the process of handling the semiconductor device structure 108. During the eighth stage, the barrier material 106 may be removed. For example, an etching process or application of heat utilizing another laser may be used to remove the barrier material 106 from the second adhesive material 116. More specifically, a dry (RIE) or wet etch may be employed to remove the barrier material 106 without stressing the semiconductor device structure 108, leaving the surface 118 of the second adhesive material 116 located opposite the semiconductor device structure 108 exposed.

Figure 12:
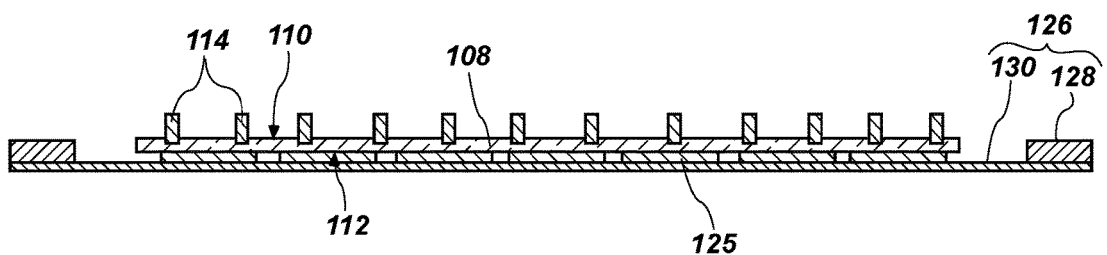

FIGS. 11 and 12 are cross-sectional side views of a ninth stage in the process of handling the semiconductor device structure 108. During the ninth stage, the semiconductor device structure 108 may be cleaned by removing the second adhesive material 116 without mechanical handling, unlike conventional cleaning processes which stress the semiconductor device structure and may cause chipping or cracking. For example, the second adhesive material 116 may be removed by exposure to a solvent formulated to dissolve the second adhesive material 116 therein. Because dissolution of the second adhesive material 116 in a solvent does not impose any force on the semiconductor device structure 108, stress induced in the semiconductor device structure 108 during cleaning may be reduced if not eliminated. In addition, embodiments of the present disclosure enable taping (mounting on a film frame or other support) of semiconductor device structure 108 before debonding of the carrier structure 100, enabling consistent support of the semiconductor device structure and processing of warped chips.

While embodiments of the present disclosure have been described and illustrated as utilizing the carrier structure bearing an adhesive and metal barrier material to process semiconductor device structures having an active surface facing and adhered the carrier structure, embodiments are not so limited. Those of ordinary skill in the art will understand that the methods and system of the disclosure may be employed with a semiconductor device structure adhered with the active surface facing away from the carrier structure. For example, a device wafer may be secured in such a manner for fabrication of integrated circuitry on the active surface, stacking or other placement of dice on the device wafer, or other processing without the use of a chuck or other mechanical restraint to support and secure the device wafer.

One embodiment of the disclosure may be characterized as a method of processing a semiconductor device structure comprises directing a laser beam through a carrier structure comprising a semiconductive material to heat a barrier material located between the carrier structure and a semiconductor device structure, releasing a bond between the carrier structure and an adhesive material securing the carrier structure to the semiconductor device structure responsive to the heating, and removing the carrier structure from the barrier material.

Another embodiment of the disclosure may be characterized as a method of processing a semiconductor device structure comprising securing a carrier structure comprising a semiconductive material to a semiconductor device structure with a first adhesive material in contact with the carrier structure, a barrier material located on a side of the first adhesive material opposite the carrier structure, and a second adhesive material located between the barrier material and the semiconductor device structure. A support structure may be secured to the semiconductor device structure on a side of the semiconductor device structure opposite the carrier structure and a laser beam may be directed through the semiconductive material of the carrier structure to impinge on the barrier material. A bond between the carrier structure and the first adhesive material may be released in response to heating of the barrier material by the laser beam and the carrier structure removed from the semiconductor device structure.

A further embodiment of the disclosure may be characterized as a semiconductor device assembly comprising a carrier wafer of semiconductor material, a thermoset adhesive on a surface of the carrier wafer, a metal barrier material on the thermoset adhesive, a thermoplastic adhesive on an opposite side of the metal barrier material from the thermoset adhesive, and a device wafer on an opposite side of the thermoplastic material from the metal barrier material.

Yet another embodiment of the disclosure may be characterized as a semiconductor device processing system comprising a carrier wafer comprising a semiconductive material having a thermoset adhesive, a partially cured thermoset adhesive, or a thermoset adhesive precursor adhered to a surface thereof and a metal barrier material adhered to the thermoset adhesive opposite the carrier wafer; and a laser apparatus located on an opposite side of the carrier wafer from the metal barrier material and positioned to aim a laser beam through the carrier wafer to impinge on the metal barrier material.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure, as contemplated by the inventors.

What is claimed is:

1. A method of processing a semiconductor device, the method comprising:
   directing a laser beam through a carrier structure to heat a barrier material located between the carrier structure and a semiconductor device structure on an opposite side of the barrier material;
   releasing a bond between the carrier structure and an adhesive material securing the carrier structure to the barrier material responsive to the heat, the adhesive material comprising a thermoset material;
   leaving the barrier material intact and leaving a temporary attachment between the barrier material, another adhesive material securing the semiconductor device structure to the barrier material, and the semiconductor device structure intact, the another adhesive material comprising a thermoplastic material; and
   removing the carrier structure from the barrier material.

2. The method of claim 1, wherein directing the laser beam through the carrier structure comprises directing the laser beam through a semiconductive material of the carrier structure.

3. The method o claim 1, further comprising, before directing the laser beam, bonding the semiconductor device structure to the barrier material with the another adhesive material.

4. The method of claim 3, wherein releasing the bond between the carrier structure and the adhesive material comprises one of vaporizing or ashing the adhesive material.

5. The method of claim 3, wherein leaving the temporary attachment between the barrier material, the another adhesive material securing the semiconductor device structure to the barrier material, and the semiconductor device structure intact comprises maintaining a temperature of the another adhesive material below about 400° C.

6. The method of claim 3, wherein releasing the bond between the carder structure and the adhesive material in response to the heat comprises releasing the bond between the carder structure and the adhesive material at a temperature lower than a glass transition temperature of the another adhesive material.

7. The method of claim 3, further comprising removing the barrier material from the another adhesive material after removing the carrier structure from the semiconductor device structure.

8. The method of claim 7, wherein removing the barrier material from the another adhesive material comprises etching the barrier material from the another adhesive material.

9. The method of claim 7, further comprising removing the another adhesive material from the semiconductor device structure after removing the barrier material from the another adhesive material.

10. The method of claim 9, wherein removing the another adhesive material from the semiconductor device structure comprises exposing the another adhesive material to a solvent.

11. The method of claim 1, wherein removing the carrier structure from the barrier material comprises laterally or vertically displacing the carrier structure relative to the semiconductor device structure while the semiconductor device structure is supported by a support structure.

12. The method of claim 1, wherein removing the carrier structure from the semiconductor device structure comprises applying substantially zero force on the semiconductor device structure when removing the carrier structure.

13. The method of claim 1, wherein directing the laser beam through the carrier structure to the barrier material comprises directing the laser beam at an infrared, an ultraviolet, or a green wavelength through the carrier structure to the barrier material.

14. The method of claim 1, wherein directing the laser beam through the carrier structure to the barrier material comprises directing the laser beam through the carrier structure to the barrier material exhibiting a thickness of 0.5 microns or less.

15. A method of processing a semiconductor device structure, comprising:
   securing a carrier structure to a semiconductor device structure with a first adhesive material comprising a thermoset material in contact with the carrier structure, a barrier material located on a side of the first adhesive material opposite the carrier structure, and a second adhesive material comprising a thermoplastic material located between the barrier material and the semiconductor device structure;
   securing a support structure to the semiconductor device structure on a side of the semiconductor device structure opposite the carrier structure;
   directing a laser beam through the first adhesive material of the carrier structure to impinge on the barrier material;

releasing a bond between the carrier structure and the first adhesive material responsive to heating of the barrier material by the laser beam;

leaving the barrier material intact and leaving a temporary attachment between the barrier material, the second adhesive material, and the semiconductor device structure intact; and removing the carrier structure from the semiconductor device structure.

16. The method of claim 15, wherein securing the carrier structure to the semiconductor device structure comprises placing the first adhesive material on the carrier structure, placing the barrier material on the first adhesive material, placing the second adhesive material on the semiconductor device structure, and contacting the second adhesive material to the barrier material.

17. The method of claim 15, wherein securing the carrier structure to the semiconductor device structure comprises placing the second adhesive material on the semiconductor device structure, placing the barrier material on the second adhesive material, placing a precursor material to the first adhesive material or partially curing the first adhesive material on the barrier material, contacting the carrier structure to the precursor material or the partially cured first adhesive material, and curing the precursor material or partially cured first adhesive material to form the first adhesive material.

18. The method of claim 15, further comprising reducing a thickness of the semiconductor device structure after securing the semiconductor device structure to the carrier structure and before securing the support structure to the semiconductor device structure.

19. The method of claim 18, further comprising reducing a thickness of the carrier structure before reducing the thickness of the semiconductor device structure and while secured to the semiconductor device structure.

20. The method of claim 19, wherein reducing the thickness of the carrier structure and reducing the thickness of the semiconductor device structure comprises utilizing a same thickness-reduction apparatus to reduce the thickness of the carrier structure and to reduce the thickness of a semiconductor device wafer by removing a semiconductor material of the carrier structure and removing a semiconductor material of the semiconductor device wafer.

21. The method of claim 15, wherein securing the support structure to a semiconductor device wafer comprises securing the semiconductor device wafer to an adhesive film carried by a film frame.

* * * * *

UNITED STATES PATENT AND TRADEMARK OFFICE
CERTIFICATE OF CORRECTION

PATENT NO. : 10,403,598 B2
APPLICATION NO. : 15/674850
DATED : September 3, 2019
INVENTOR(S) : Andrew M. Bayless and Joseph M. Brand It is certified that error appears in the above-identified patent and that said Letters Patent is hereby corrected as shown below:

In the Claims

| | | | |
|---|---|---|---|
| Claim 3, | Column 11, | Line 64, | change "method o claim" to --method of claim-- |
| Claim 6, | Column 12, | Line 11, | change "the carder structures" to --the carrier structures-- |
| Claim 6, | Column 12, | Line 13, | change "the carder structures" to --the carrier structures-- |
| Claim 14, | Column 12, | Line 51, | change "0.5microns or" to --0.5 microns or-- |

Signed and Sealed this
Eighth Day of October, 2019

Andrei Iancu
*Director of the United States Patent and Trademark Office*